(12) United States Patent
AuBuchon et al.

(10) Patent No.: US 11,761,083 B2
(45) Date of Patent: Sep. 19, 2023

(54) METHODS FOR CONTROLLING A FLOW PULSE SHAPE

(71) Applicant: Applied Materials, Inc., Santa Clara, CA (US)

(72) Inventors: Joseph AuBuchon, San Jose, CA (US); Kevin Griffin, Livermore, CA (US); Hanhong Chen, Milpitas, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 358 days.

(21) Appl. No.: 17/025,405

(22) Filed: Sep. 18, 2020

(65) Prior Publication Data

US 2021/0087688 A1 Mar. 25, 2021

Related U.S. Application Data

(60) Provisional application No. 62/902,918, filed on Sep. 19, 2019.

(51) Int. Cl.
*C23C 16/455* (2006.01)
*H01L 21/67* (2006.01)
*H01L 21/02* (2006.01)

(52) U.S. Cl.
CPC .. *C23C 16/45557* (2013.01); *C23C 16/45527* (2013.01); *C23C 16/45544* (2013.01); *H01L 21/0228* (2013.01); *H01L 21/67253* (2013.01)

(58) Field of Classification Search
CPC .................. C23C 16/45557; C23C 16/45527
See application file for complete search history.

(56) References Cited

U.S. PATENT DOCUMENTS

| 4,202,602 | A | * | 5/1980 | Torres | G02B 26/02 335/11 |
| 6,720,027 | B2 | * | 4/2004 | Yang | C23C 16/45544 257/E21.171 |
| 6,777,352 | B2 | * | 8/2004 | Tepman | H01L 21/28562 118/723 VE |
| 7,975,558 | B2 | | 7/2011 | Lee et al. | |
| 8,286,939 | B2 | * | 10/2012 | Li | F16K 7/10 251/290 |
| 9,314,824 | B2 | * | 4/2016 | Gu | B08B 9/0321 |
| 9,790,594 | B2 | * | 10/2017 | Huotari | C23C 16/45561 |
| 2001/0002581 | A1 | * | 6/2001 | Nishikawa | C23C 16/45557 118/715 |

(Continued)

FOREIGN PATENT DOCUMENTS

WO 9904615 A1 2/1999
WO 2012116281 A1 8/2012

OTHER PUBLICATIONS

Dermawan, T., et al., "Gas flow control design vapor deposition in chemical facilities". IOP Conf. Series: Journal of Physics: Conf. Series 1436 (2020) 012109, pp. 1-10.*

(Continued)

*Primary Examiner* — Bret P Chen
(74) *Attorney, Agent, or Firm* — Servilla Whitney LLC

(57) ABSTRACT

Methods for controlling pulse shape in ALD processes improves local non-uniformity issues of films deposited on substrate surface. The methods include using a variable flow valve creating predetermined pulse shape when a reactant is provided on a substrate surface.

13 Claims, 3 Drawing Sheets

(56) References Cited

U.S. PATENT DOCUMENTS

| | | | |
|---|---|---|---|
| 2003/0079686 A1* | 5/2003 | Chen | C23C 16/4411 257/E21.171 |
| 2003/0153177 A1* | 8/2003 | Tepman | C23C 16/45527 257/E21.171 |
| 2005/0145333 A1* | 7/2005 | Kannan | H01L 21/28562 257/E21.171 |
| 2009/0209095 A1* | 8/2009 | Horii | H01L 21/67745 438/585 |
| 2014/0131278 A1* | 5/2014 | Sakamoto | B01D 65/02 210/257.2 |
| 2014/0238498 A1* | 8/2014 | Ding | G05D 11/132 137/624.18 |
| 2014/0352697 A1* | 12/2014 | Lee | A61M 16/0677 128/204.23 |
| 2016/0158428 A1* | 6/2016 | Charest | A61M 1/3434 210/321.65 |
| 2017/0236719 A1* | 8/2017 | O'Meara | H01L 21/31116 438/703 |
| 2018/0066360 A1 | 3/2018 | Huotari et al. | |

OTHER PUBLICATIONS

Akbarzadeh, Kamran, et al., "Asphaltene Deposition Measurement and Modeling for Flow Assurance of Tubings and Flow Lines". Energy Fuels 2012, 26, 495-510.*

Tu, Haink C., et al., "Design, Modeling, and Validation of a High-Speed Rotary Pulse-Width-Modulation On/Off Hydraulic Valve". J. Dyn. Sys., Meas., Control. Nov. 2012, 134(6): 061002 (13 pages).*

Ablat, Hayrensa, et al., "Molecular Layer Deposition of Organic-Inorganic Hafnium Oxynitride Hybrid Films for Electrochemical Applications" ACS Applied Energy Materials, 2023, pp. 1-11.*

PCT International Search Report and Written Opinion in PCT/US2020/051521 dated Jan. 6, 2021, 12 pages.

* cited by examiner

METHODS FOR CONTROLLING A FLOW PULSE SHAPE

CROSS-REFERENCE TO RELATED APPLICATIONS

This application claims priority to U.S. Provisional Application No. 62/902,918, filed Sep. 19, 2019, the entire disclosure of which is hereby incorporated by reference herein.

TECHNICAL FIELD

The present invention relates to methods for controlling pulse shape in ALD processes. In particular, embodiments of the disclosure relate to generating predetermined flow pulse profile using a variable flow valve.

BACKGROUND

Atomic layer deposition typically involves reacting alternating pulses of two or more reactants to deposit film layers on a substrate surface in a reaction chamber. The pulse is generally formed when a valve is opened. FIG. 1 illustrates a schematic of a common gas delivery system 10. An ampoule 12 is connected through gas lines 11 to a mass flow controller 14, a downstream reservoir 15, an atomic layer deposition (ALD) valve 17 into the process chamber 19.

A square wave pulse, see FIG. 2A is intended by the opening and closing of the ALD valve 17. However, upon opening the ALD valve 17, a drop in pressure results in a pulse shape resembling FIG. 2B. The pulse will have a shape that includes a rising transition at the start, a falling transition at the end, and potentially a trend in the middle if the flow through the valve isn't constant during the duration of the pulse. Additionally, the transitions of ALD valve 17 from closed to open, and vice versa, should be fast to minimize the rising and falling transitions, and the shape of the pulse should match from pulse to pulse.

One disadvantage of the current state of art is that the pulses are of short duration. In the absence of any pulse controlling system, different parts of the substrate surface in the reaction chamber will see the pulses at different times and of different dose, creating localized non-uniformity issues. For example, FIG. 3 illustrates a portion of a typical reaction chamber where the gases are delivered from a showerhead 20, or other gas injector, above the substrate 30 and flow out radially towards a pump. The center of the substrate 30 surface will see the pulse before the edge and will also see the pulse removed before the edge. Moreover, the flow rate of the gas, indicated by arrows 25, accelerate as the gas moves from the center of the wafer to the edge, resulting in non-uniform precursor dosing across the wafer surface.

Therefore, there is a need in the art for methods for controlling pulse shape in ALD processes to improve uniformity.

SUMMARY

One or more embodiments of the disclosure are directed to processing method comprising flowing a gas through a variable flow valve to a substrate support. The variable flow valve is controlled to generate a predetermined flow pulse profile to the inner region and outer region of the substrate support.

Additional embodiments of the disclosure are directed to gas delivery systems comprising: a gas reservoir having a charged pressure; a variable flow valve; and a controller configured to control the variable flow valve to generate a predetermined flow pulse profile downstream of the variable flow valve.

Further embodiments of the disclosure are directed to non-transitory computer readable medium including instructions, that, when executed by a controller of a processing chamber, causes the processing chamber to control a variable flow valve to generate a predetermined flow pulse profile to an inner region and an outer region of a substrate support.

BRIEF DESCRIPTION OF THE DRAWING

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments. The embodiments as described herein are illustrated by way of example and not limitation in the figures of the accompanying drawings in which like references indicate similar elements.

DETAILED DESCRIPTION

Before describing several exemplary embodiments of the invention, it is to be understood that the invention is not limited to the details of construction or process steps set forth in the following description. The invention is capable of other embodiments and of being practiced or being carried out in various ways.

A "substrate" as used herein, refers to any substrate or material surface formed on a substrate upon which film processing is performed during a fabrication process. For example, a substrate surface on which processing can be performed include materials such as silicon, silicon oxide, silicon dioxide, strained silicon, silicon on insulator (SOI), carbon doped silicon oxides, amorphous silicon, doped silicon, and any other materials such as metals, metal nitrides, metal alloys, and other conductive materials including aluminum oxide, depending on the application. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface.

As used in this specification and the appended claims, the terms "precursor", "reactant", "reactive gas" and the like are used interchangeably to refer to any gaseous species that can react with the substrate surface.

One or more embodiments of the disclosure are directed to methods for controlling the shape of the gas pulse injected into a processing chamber. In some embodiments, the pulse shape is controlled using a valve with variable flow during the pulse in order to create different pulse profiles on the wafer. In some embodiments, the variable flow valve has a variable opening size which can be changed during the pulse.

Some embodiments advantageously provide the ability to match one or more of the concentration, dose or residence time at different portions of the wafer surface. Some embodiments advantageously provide smoother transitions between two gases. Some embodiments are used with back-to-back plasma processes with improved dose control. Some embodiments create controlled disturbances in the gas flow for local non-uniformity improvement.

Figure 4:
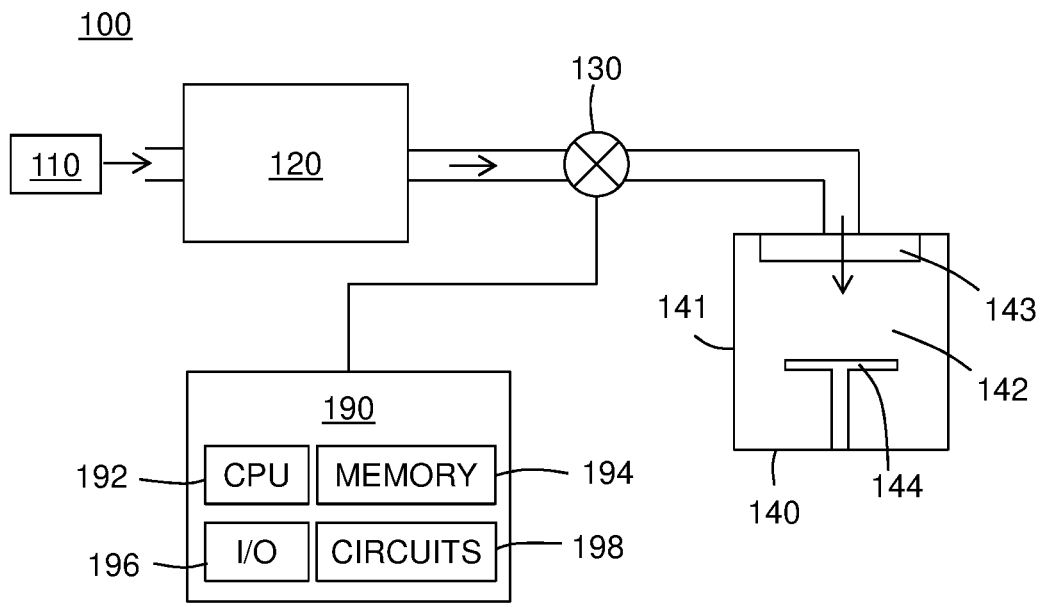
FIG. 4 illustrates a process flow diagram of a method according to one or more embodiments.

FIG. 4 illustrates a schematic representation of a gas delivery system 100 according to one or more embodiment of the disclosure. The gas delivery system 100 illustrated comprises a gas source gas 110. The gas source can be any suitable gas source including, but not limited to, precursor ampoules and house gas lines.

The gas source 110 is in fluid communication with a gas reservoir 120 located downstream of the gas source 110. The terms "upstream" and "downstream" are used to describe the position of components relative to the direction of flow of gas. The direction of flow is from the gas source 110 to the processing chamber 140.

In some embodiments, a valve (not shown) is positioned between the gas source 110 and the gas reservoir 120. In some embodiments, the valve allows for the removal and/or replacement of the gas source 110. In some embodiments, the valve allows the system to charge the gas reservoir 120 to a predetermined pressure by opening and closing at predetermined intervals to maintain a predetermined pressure.

The gas reservoir 120 is down stream of the gas source 110 and maintains a supply of gas. The gas reservoir is charged from the gas source 110 to a predetermined pressure, referred to as the charged pressure. The charged pressure is the target pressure in the reservoir, which may or may not be the maximum pressure rating for the reservoir. In some embodiments, the charged pressure is less than or equal to 98%, 95%, 90%, 80%, 70%, 60%, 50%, 40%, 30%, 20% or 10% of the maximum pressure rating for the reservoir.

The gas reservoir 120 of some embodiments includes a sufficient pressure and/or volume to prevent large fluctuations during draw periods. For example, when the variable flow valve 130, located downstream of the gas reservoir, is opened, the flow does not change the pressure and/or volume of gas in the reservoir by greater than or equal to 10%, 8%, 6%, 4%, 2% or 1% relative to the charged pressure and/or volume.

The variable flow valve of some embodiments is a fast acting valve that has a short full actuation time. In some embodiments, the variable flow valve has a full actuation time less than or equal to 30 milliseconds (msec). In some embodiments, the variable flow valve has a full actuation time less than or equal to 25 milliseconds, 20 milliseconds, 15 milliseconds or 10 milliseconds. In some embodiments, the variable flow valve has a full actuation time in the range of 5 milliseconds to 25 milliseconds, or in the range of 10 milliseconds to 20 milliseconds.

Figure 1:
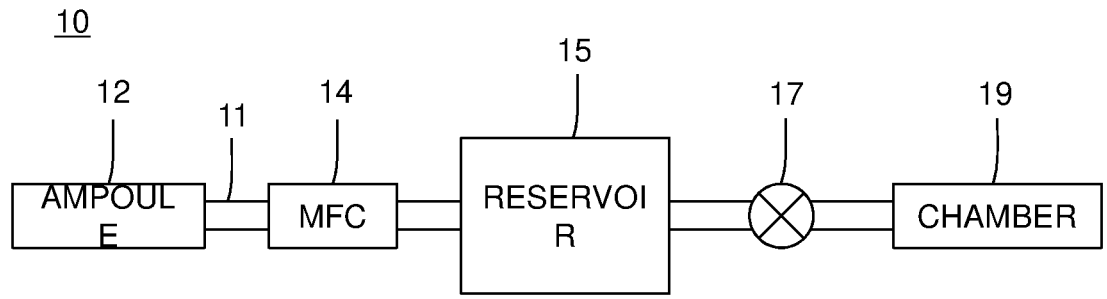
FIG. 1 illustrates a schematic representation of a prior art gas delivery system.
Figure 2A:
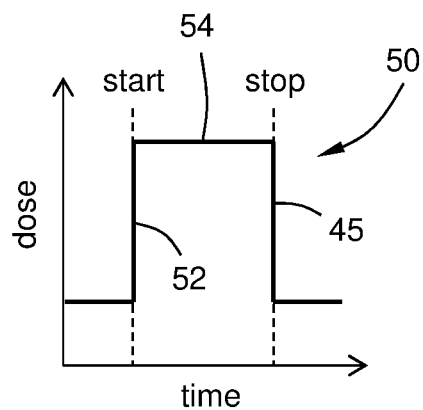
FIG. 2A illustrates a square wave pulse shape.
Figure 2B:
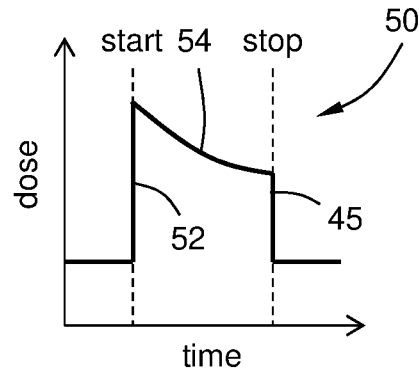
FIG. 2B illustrates a typical pulse shape from a system according to FIG. 1.
Figure 3:
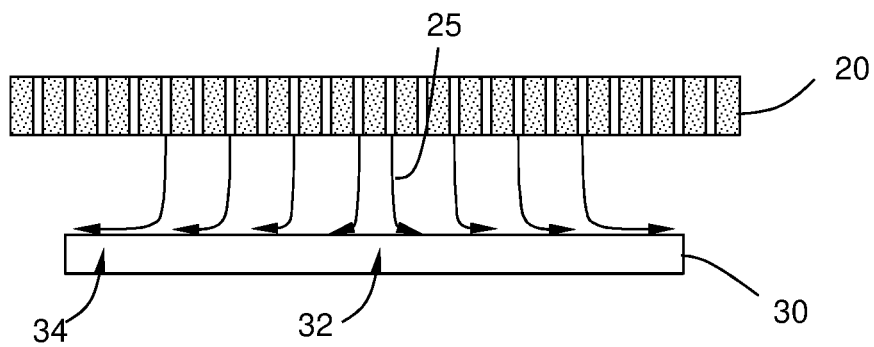
FIG. 3 illustrates a schematic representation of gas flows in a process chamber at the substrate surface.

Referring to the pulse illustrated in FIGS. 2A and 2B, the three portions of the pulse profile 50 are the rising transition 52, the intermediate transition phase 54 and the falling transition 56. In one or more embodiments, the flow pulse profile 50 includes a rising transition 52. During the rising transition 52 phase, the variable flow valve is moved from a closed position in which no flow occurs to an open position for the predetermined initial flow. For example, the variable flow valve initially closed takes time to move to the predetermined open position. The portion of the flow pulse profile 50 from the start of the valve opening to the predetermined open position is defined as the rising transition 52. The predetermined open position can be any suitable position depending on, for example, the size of the variable flow valve, the flow rate through the valve and/or the dose to be delivered. In some embodiments, the rising transition 52 phase results in the variable flow valve being fully open, partially open, progressively opening fully, and progressively opening partially.

In one or more embodiments, the predetermined flow pulse profile includes a falling transition phase 56. The falling transition phase 56 may result in one or more of the variable flow valve closing fully, closing partially, progressively closing fully, and progressively closing partially. The falling transition phase 56 is measured as the time period from the point at which the variable flow valve 130 begins to fully close and is fully closed.

In one or more embodiments, the predetermined flow pulse profile includes an intermediate transition phase 54. The intermediate transition phase 54 is the time period between the rising transition phase 52 and the falling transition phase 56. The intermediate transition phase 54 of some embodiments results in one or more of the variable flow valve opening fully, opening partially, progressively opening fully, progressively opening partially, closing partially, progressively closing partially, maintaining partial open state, or maintaining full open state.

In one or more embodiments, one or more of an input and an output of the variable flow valve has one or more variable openings. In some embodiments, the variable opening is configured to change during the operation of the flow valve. In one or more embodiments, the variable flow valve has a pressure sensor (not shown). In some embodiments, the variable opening is configured to change the size of the opening as a function of one or more of time and pressure. In some embodiments, the variable flow valve also comprises directing the flow of gas to multiple substrate supports at the same time.

Figure 5:
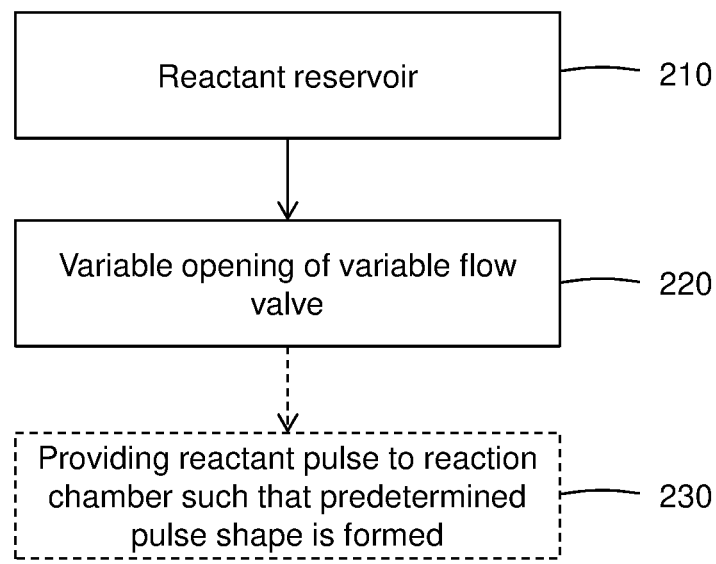
FIG. 5 illustrates a schematic representation of the method according to one or more embodiment.

FIG. 5 illustrates a flowchart of an embodiment of the method 200 according to one or more embodiment of the disclosure. In one or more embodiments, the variable flow valve 130 is configured to provide a flow pulse profile from a pulse start to a pulse end with a pulse maximum flow at the pulse start and tapering to a pulse minimum flow at the pulse end. In some embodiments, before the pulse start and after the pulse end, there is no flow through the variable flow valve. In some embodiments, the flow pulse profile has a linear taper from the pulse maximum flow to the pulse minimum flow. In one or more embodiments, the flow pulse profile has a non-linear taper from the pulse maximum flow to the pulse minimum flow.

In one or more embodiments, the variable flow valve comprises a first input, a second input and a controller configured to control the opening of the first input and the second input in a predetermined order. In some embodiments, the variable flow valve may optionally have a third input connected to an inert gas supply valve. In some embodiments, the inert gas supply valve is connected to $N_2$, Ar, He, Ne or Kr gas reservoir. In some embodiments, the variable flow valve may have a cleansing vent. In some embodiments, the cleansing vent is connected to a vacuum. In some embodiments, each inputs, the first input and the second input, has a variable opening. In some embodiments, the variable opening is configured to change the size of the opening during functioning of the variable flow valve. In some embodiments, the variable opening is configured to change the size of the opening as a function of one or more of time and pressure.

Downstream of the variable flow valve 130 is the processing chamber 140. The processing chamber 140 can be any suitable chamber including semiconductor manufacturing chambers and low-pressure chambers used in non-semiconductor processing. In some embodiments, the processing chamber 140 comprises an atomic layer deposition (ALD) or chemical vapor deposition (CVD) processing chamber. In general, the ALD and/or CVD chamber comprises a chamber body 141 enclosing an interior volume 142. A gas injector 143 (which may also be referred to as a showerhead) is in fluid communication with the variable flow valve 130 to provide a flow of gas into the interior volume 142. The processing chamber 140 includes a substrate support 144 to hold a substrate during processing.

In one or more embodiments, the flow pulse profile 300 generates a uniform dosage across both the inner region 32 and outer region 34 of the substrate 30. According to one or more embodiment, method 200 begins with a reactant 210 stored in a reservoir 120. The method step 220 is performed by providing the reactant through a variable flow valve 130 to a reaction chamber 140. In some embodiments the variable flow valve 130 has a variable opening configured to change size during the functioning of the variable flow valve. For the method step 230, the reactant pulse is provided to the processing chamber 140 with the predetermined pulse shape 300.

In some embodiments, the variable flow valve 130 is connected to at least one controller 190. In some embodiments, the controller 190 is configured to operate the variable flow valve 130 to form the predetermined pulse shape 300. In some embodiments, the size of the opening in the variable flow valve 130 varies as a function of time. In some embodiments, the opening in the variable flow valve 130 is varied as a result of pressure changes in the reservoir.

The at least one controller 190 of some embodiments has a processor 192, a memory 194 coupled to the processor 192, input/output devices 196 coupled to the processor 192, and support circuits 198 to communication between the different electronic components. The memory 194 can include one or more of transitory memory (e.g., random access memory) and non-transitory memory (e.g., storage).

The memory 194, or computer-readable medium, of the processor may be one or more of readily available memory such as random access memory (RAM), read-only memory (ROM), floppy disk, hard disk, or any other form of digital storage, local or remote. The memory 194 can retain an instruction set that is operable by the processor 192 to control parameters and components of the system. The support circuits 198 are coupled to the processor 192 for supporting the processor in a conventional manner. Circuits may include, for example, cache, power supplies, clock circuits, input/output circuitry, subsystems, and the like.

Processes may generally be stored in the memory as a software routine that, when executed by the processor, causes the process chamber to perform processes of the present disclosure. The software routine may also be stored and/or executed by a second processor (not shown) that is remotely located from the hardware being controlled by the processor. Some or all of the method of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general purpose computer into a specific purpose computer (controller) that controls the chamber operation such that the processes are performed.

In some embodiments, the controller 190 has one or more configurations to execute individual processes or sub-processes to perform the method. The controller 190 can be connected to and configured to operate intermediate components to perform the functions of the methods. For example, the controller 190 can be connected to and configured to control one or more of gas valves, actuators, motors, slit valves, vacuum control, pressure gauges, etc.

The controller 190 of some embodiments has one or more configurations selected from: a configuration to control the rising transition phase 52 of a pulse through a variable flow valve 130; a configuration to control the intermediate transition phase 54 of a pulse through the variable flow valve 130; a configuration to control the falling transition phase 56 of a pulse through a variable flow valve 130; a configuration to measure pressure in a pressure reservoir 120; and/or a configuration to charge a pressure reservoir 120.

Figure 6:
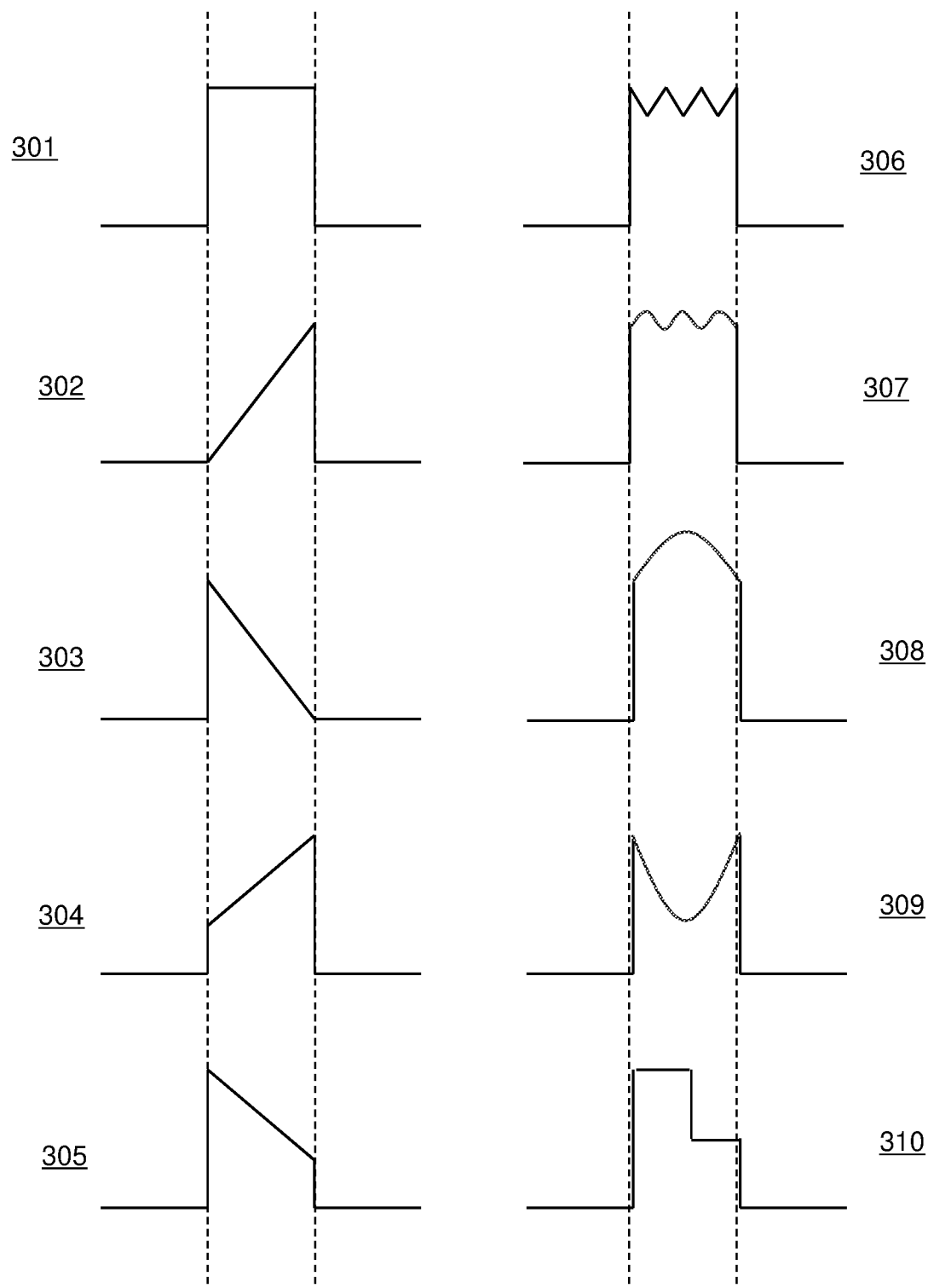
FIG. 6 illustrates representative pulse shapes for reactants that can be configured using one or more embodiment of the disclosure.

Referring to FIG. 6, the pulse shape 300 can be controlled to create a more uniform precursor dose across the inner region and outer regions of the substrate. Pulse profiles can be generated with linear intermediate transition phases 54, like pulses 301 and 305. In some embodiments, the pulse profile has no intermediate transition phases 54, like pulses 302 and 303. In some embodiments, the pulse profile has a non-liner intermediate transition phase 54 like pulses 306-309. In some embodiments, the pulse profile is stepped, like pulse 310. The skilled artisan will recognize that the pulse profiles 300 illustrated in FIG. 6 are merely representative of possible pulse profiles and that the individual profile used may depend on, for example, the gas injector, the substrate to gas injector spacing, the flow rates, the reservoir size/pressure, etc.

In one or more embodiments, a gas delivery system comprises a gas reservoir having a charged pressure, a variable flow valve, and a controller configured to control the variable flow valve to generate a predetermined flow pulse profile downstream of the variable flow valve. In some embodiments, the variable flow valve is downstream of and in fluid communication with the gas reservoir. In some embodiments, the variable flow valve is upstream of and in fluid communication with the gas reservoir. In some embodiments, the variable flow valve comprises one or more of a variable input and a variable output having a variable opening. In some embodiments, the size of opening changes as a function of one or more of a time and a pressure.

In one or more embodiments, the gas delivery system is connected to one processing chamber. In some embodiments, the gas delivery system is connected to multiple process chambers at the same time. In a multi-chamber system, the gas line splits upstream of the variable flow valve 130 into multiple gas legs, each leg having a separate variable flow valve 130.

In some embodiments, there are multiple reservoirs upstream of the variable flow valve. In some embodiments, the variable flow valve has multiple inputs connected to the multiple reservoirs. In some embodiments, the variable flow valve has multiple outputs, each output connected to a different processing chamber.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed is:

1. A processing method comprising:
   flowing a gas through a variable flow valve to a substrate support; and
   controlling the variable flow valve to generate a predetermined flow pulse profile to the inner region and outer region of the substrate support,
   wherein the variable flow valve is configured to provide a flow pulse profile from a pulse start to a pulse end with a pulse maximum flow at the pulse start and tapering to a pulse minimum flow at the pulse end.

2. The processing method of claim 1, wherein the flow pulse profile has a rising transition phase comprising one or more of the variable flow valve opening fully, opening partially, progressively opening fully, and progressively opening partially.

3. The processing method of claim 2, wherein the flow pulse profile has a falling transition phase comprising one or more of the variable flow valve closing fully, closing partially, progressively closing fully, and progressively closing partially.

4. The processing method of claim 3, wherein the flow pulse profile has an intermediate transition phase, wherein the intermediate transition phase occurs between the rising transition phase and the falling transition phase.

5. The processing method of claim 4, wherein the intermediate transition phase comprises one or more of the variable flow valve opening fully, opening partially, progressively opening fully, progressively opening partially, closing partially, progressively closing partially, maintaining partial open state, and maintaining full open state.

6. The processing method of claim 1, wherein one or more of an input and an output of the variable flow valve comprises a variable opening.

7. The processing method of claim 6 further comprises directing the flow of gas to multiple substrate supports at the same time.

8. The processing method of claim 6, wherein the variable flow valve has more than one output.

9. The processing method of claim 1, wherein the variable flow valve has a pressure sensor.

10. The processing method of claim 1, there is no flow through the variable flow valve before the pulse start and after the pulse end.

11. The processing method of claim 1, wherein the flow pulse profile has a linear taper from the pulse maximum flow to the pulse minimum flow.

12. The processing method of claim 1, wherein the flow pulse profile has a non-linear taper from the pulse maximum flow to the pulse minimum flow.

13. The processing method of claim 1, wherein the flow pulse profile generates a uniform dosage across both the inner region and outer region of the substrate support.

\* \* \* \* \*